United States Patent
Kautzsch

(10) Patent No.: US 9,860,518 B2
(45) Date of Patent: Jan. 2, 2018

(54) IMAGING CIRCUITS AND A METHOD FOR OPERATING AN IMAGING CIRCUIT

(71) Applicant: Infineon Technologies AG, Neubiberg (DE)

(72) Inventor: Thoralf Kautzsch, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 292 days.

(21) Appl. No.: 14/849,903

(22) Filed: Sep. 10, 2015

(65) Prior Publication Data
US 2016/0073093 A1    Mar. 10, 2016

(30) Foreign Application Priority Data

Sep. 10, 2014 (DE) .................. 10 2014 113 037

(51) Int. Cl.
| | |
|---|---|
| H04N 13/02 | (2006.01) |
| G01S 17/08 | (2006.01) |
| G01S 17/89 | (2006.01) |
| G01S 7/486 | (2006.01) |
| H01L 27/146 | (2006.01) |
| H04N 5/369 | (2011.01) |

(Continued)

(52) U.S. Cl.
CPC ....... *H04N 13/0257* (2013.01); *G01S 7/4863* (2013.01); *G01S 17/08* (2013.01); *G01S 17/36* (2013.01); *G01S 17/89* (2013.01); *H01L 27/14614* (2013.01); *H01L 27/14638* (2013.01); *H01L 27/14645* (2013.01); *H04N 5/3698* (2013.01); *H04N 9/045* (2013.01)

(58) Field of Classification Search
CPC ......... H04N 13/0257; H04N 27/14645; H04N 5/3698; H04N 9/045; G01S 7/4863; G01S 17/08; G01S 17/36; G01S 17/89; H01L 27/14614; H01L 27/14638; H01L 27/14645
See application file for complete search history.

(56) References Cited

U.S. PATENT DOCUMENTS

| | | | |
|---|---|---|---|
| 6,218,217 B1 | 4/2001 | Uenishi et al. | |
| 7,619,270 B2 | 11/2009 | Chindalore et al. | |
| 9,151,677 B2 | 10/2015 | Seliuchenko et al. | |

(Continued)

*Primary Examiner* — David Porta
*Assistant Examiner* — Mindy Vu
(74) *Attorney, Agent, or Firm* — Eschweiler & Potashnik, LLC

(57) ABSTRACT

An imaging circuit includes a first vertical trench gate and a neighboring second vertical trench gate. The imaging circuit includes a gate control circuit. The gate control circuit operates in a first operating mode to generate a first space charge region accelerating photogenerated charge carriers of a first charge-carrier type to a first collection contact in and in a second operating mode to generate a second space charge region accelerating photogenerated charge carriers of the first charge-carrier type to the first collection contact. The imaging circuit further includes an image processing circuit which determines distance information of an object based on photogenerated charge carriers of the first charge carrier type collected at the first collection contact in the first operating mode and color information of the object based on photogenerated charge carriers of the first charge carrier type collected at the first collection contact in the second operating mode.

20 Claims, 11 Drawing Sheets

(51) Int. Cl.
*H04N 9/04* (2006.01)
*G01S 17/36* (2006.01)

(56) References Cited

U.S. PATENT DOCUMENTS

| | | | |
|---|---|---|---|
| 2003/0205741 A1 | 11/2003 | Rhodes | |
| 2006/0128087 A1* | 6/2006 | Bamji | G01S 7/4816 |
| | | | 438/199 |
| 2011/0291164 A1* | 12/2011 | Bamji | G01S 7/4816 |
| | | | 257/290 |
| 2014/0054661 A1 | 2/2014 | Yu et al. | |
| 2014/0347538 A1* | 11/2014 | Toda | H01L 27/14603 |
| | | | 348/308 |
| 2014/0374808 A1* | 12/2014 | Franke | H01L 27/14614 |
| | | | 257/290 |

\* cited by examiner

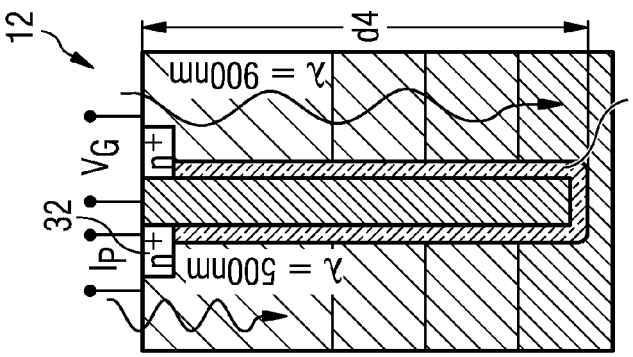
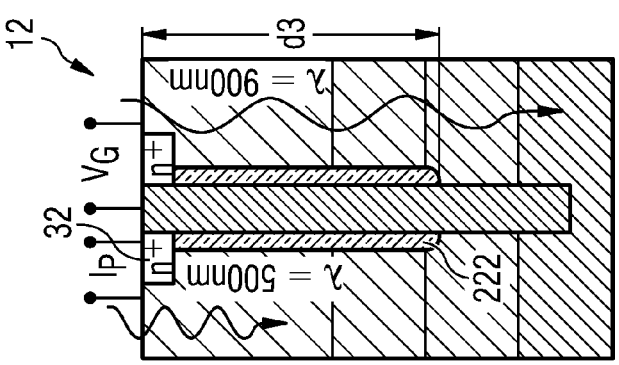
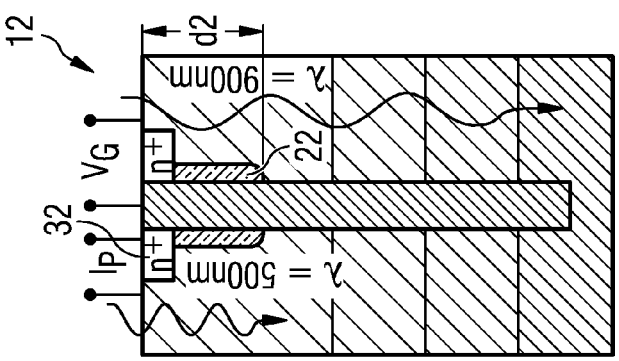
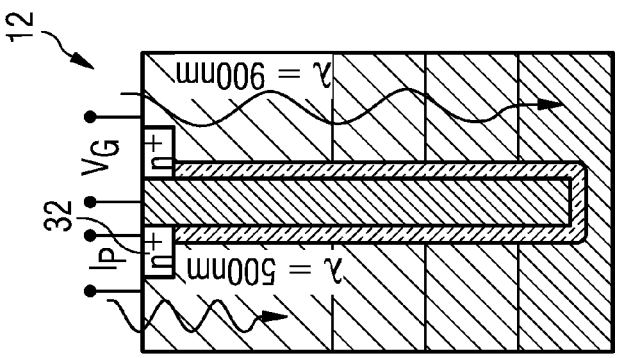

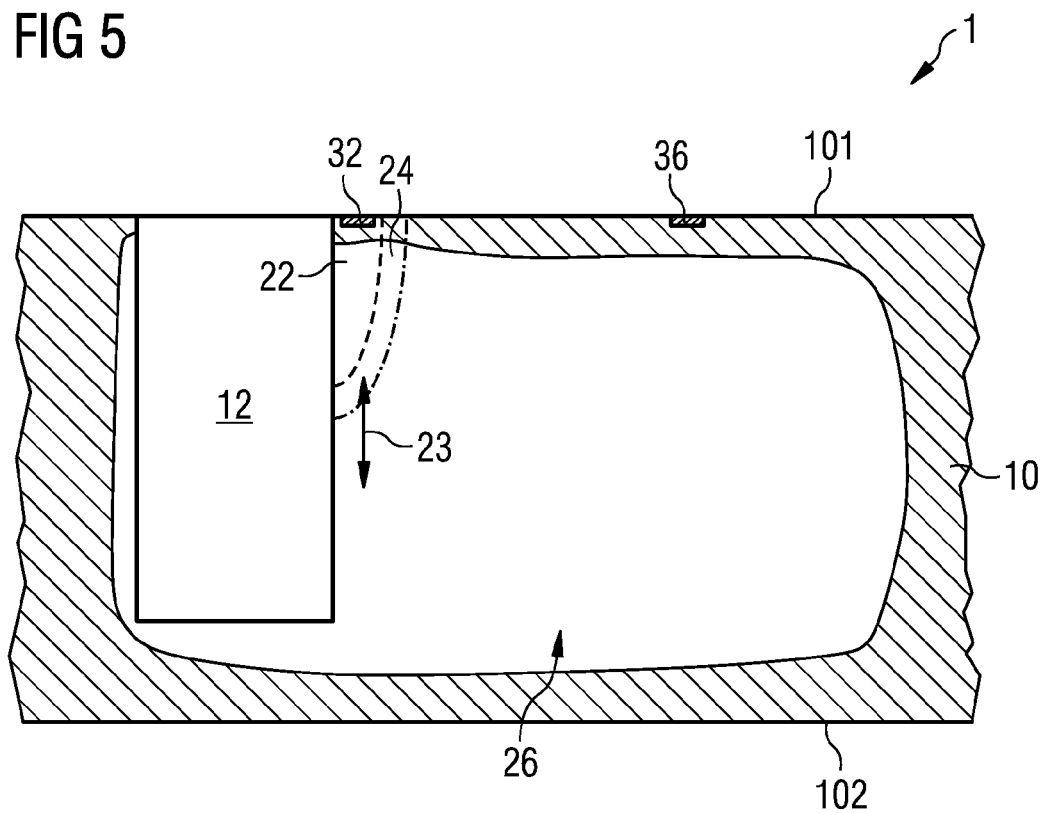

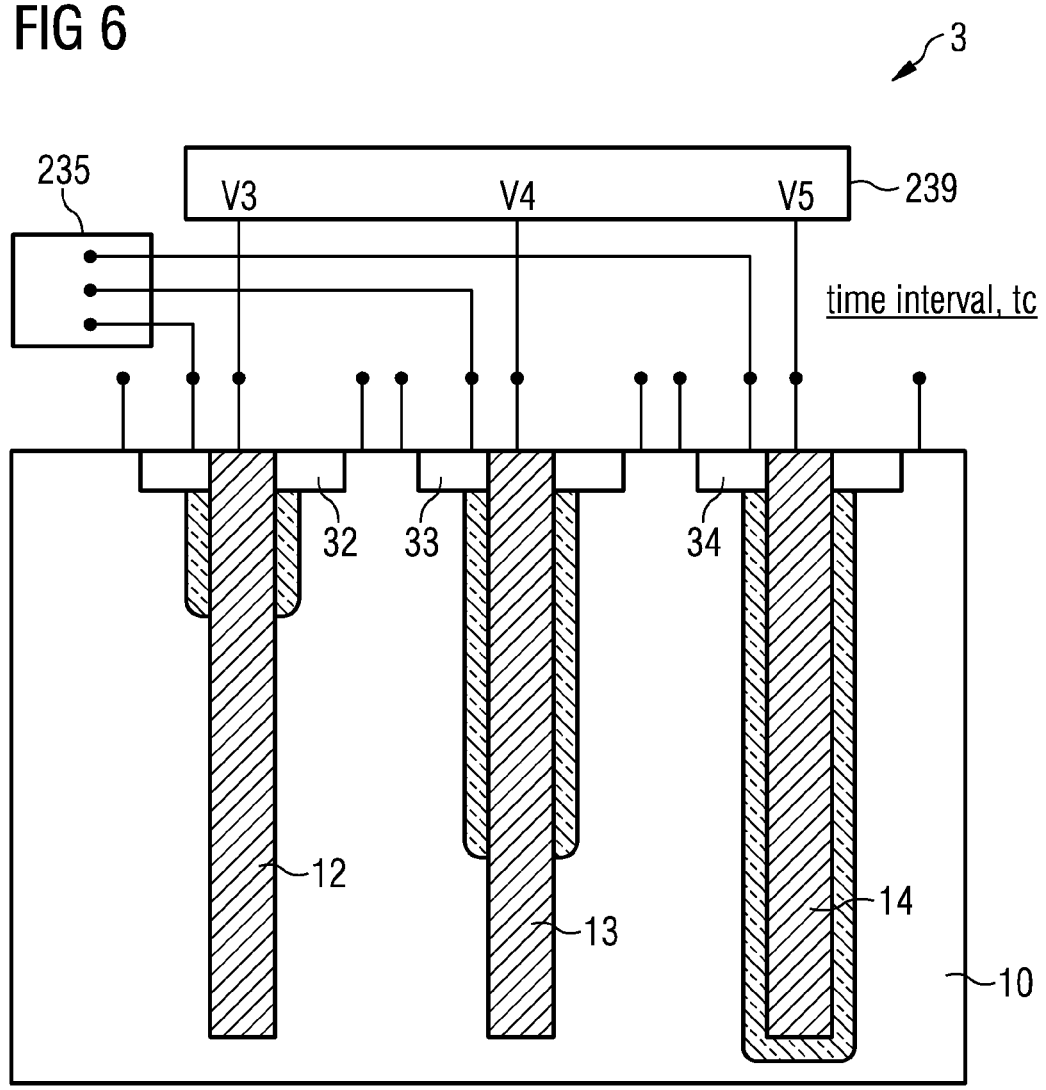

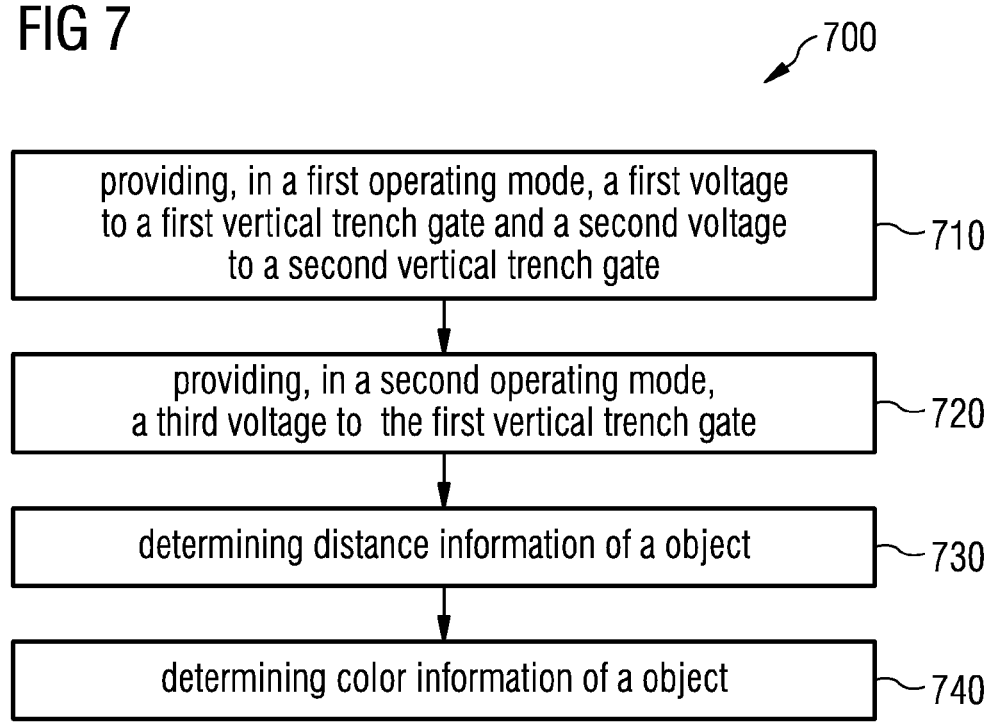

IMAGING CIRCUITS AND A METHOD FOR OPERATING AN IMAGING CIRCUIT

CROSS REFERENCE TO RELATED APPLICATIONS

This application claims priority to German Application No. 102014113037.5, filed on Sep. 10, 2014, and incorporated herein by reference in its entirety.

FIELD

Embodiments relate to producing images of objects and in particular to imaging circuits and a method for operating an imaging circuit.

BACKGROUND

Various sensors and gauges use delay measurements of acoustic and optic pulses or coded signals. In some applications, the measurement of a distance is coupled with pattern detection. This may be the case, for example, in some time-of-flight (TOF) techniques that use visible or infra-red light. Infra-red light may be a wavelength signal of choice in many applications because of its invisibility. Infra-red light has a penetration depth on the order of ten microns or more. At this depth a space charge region cannot be easily established by means of out-diffusion of a surface doping layer. Photonic mixing devices (PMD) are also incapable of color recognition since only infra-red pulsed light is evaluated. The photocells used give a fixed spectral response and thus are not designed to work as color recognition devices.

SUMMARY

The present disclosure is directed to an imaging circuit which enables the generation of three-dimensional color images.

Some embodiments relate to an imaging circuit including a semiconductor substrate and a first vertical trench gate and a neighboring second vertical trench gate extending into the semiconductor substrate. The imaging circuit further includes a gate control circuit. The gate control circuit is configured to operate in a first operating mode to provide a first voltage to the first vertical trench gate and a second voltage to the second vertical trench gate to generate a first space charge region accelerating photogenerated charge carriers of a first charge-carrier type to a first collection contact in proximity to the first vertical trench gate. The gate control circuit is further configured to operate in a second operating mode to provide a third voltage to the first vertical trench gate to generate a second space charge region accelerating photogenerated charge carriers of the first charge-carrier type to the first collection contact in proximity to the first vertical trench gate. The imaging circuit further includes an image processing circuit configured to determine distance information of an object based on photogenerated charge carriers of the first charge carrier type collected at the first collection contact in the first operating mode and to determine color information of the object based on photogenerated charge carriers of the first charge carrier type collected at the first collection contact in the second operating mode.

Some embodiments relate to an imaging circuit which includes a semiconductor substrate and a plurality of vertical trench gates extending into the semiconductor substrate. Each respective vertical trench gate has a corresponding collection contact in its proximity for collecting photogenerated charge carriers of a first charge-carrier type. The imaging circuit further includes a gate control circuit configured to provide each of the plurality of vertical trench gates with a different voltage during a collection time interval. Each respective vertical trench gate generates a respective space charge region for accelerating photogenerated charge carriers of the first charge-carrier type to its respective collection contact. The imaging circuit further includes an image processing circuit configured to determine color information of a plurality of color information types of an object, the color information of each color information type based on photogenerated charge carriers of the first charge carrier type collected at each corresponding collection contact.

Some embodiments relate to a method for operating an imaging circuit. The method includes providing, in a first operating mode, a first voltage to a first vertical trench gate and a second voltage to a second vertical trench gate to generate a first space charge region accelerating photogenerated charge carriers of a first charge-carrier type to a first collection contact in proximity to the first vertical trench gate. The method further includes providing, in a second operating mode, a third voltage to the first vertical trench gate to generate a second space charge region accelerating photogenerated charge carriers of the first charge-carrier type to the first collection contact in proximity to the first vertical trench gate. The method further includes determining distance information of an object based on photogenerated charge carriers of the first charge carrier type collected at the first collection contact in the first operating mode. The method further includes determining color information of the object based on photogenerated charge carriers of the first charge carrier type collected at the first collection contact in the second operating mode.

BRIEF DESCRIPTION OF THE DRAWINGS

Some embodiments of apparatuses and/or methods will be described in the following by way of example only, and with reference to the accompanying figures, in which

FIG. 4A shows a schematic cross-section of a vertical trench gate operating in a second operating mode according to an embodiment.

FIG. 4B shows a schematic cross-section of a vertical trench gate operating in a second operating mode according to an embodiment.

FIG. 4C shows a schematic cross-section of a vertical trench gate operating in a second operating mode according to an embodiment.

FIG. 4D shows a schematic cross-section of a vertical trench gate operating in a second operating mode according to an embodiment.

FIG. 5 shows a schematic cross-section of a vertical trench gate operating in a second operating mode according to an embodiment.

FIG. 6 shows a schematic cross-section of an imaging circuit according to an embodiment.

FIG. 7 shows a flow chart of a method for operating an imaging circuit according to an embodiment.

DETAILED DESCRIPTION

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Figure 1:
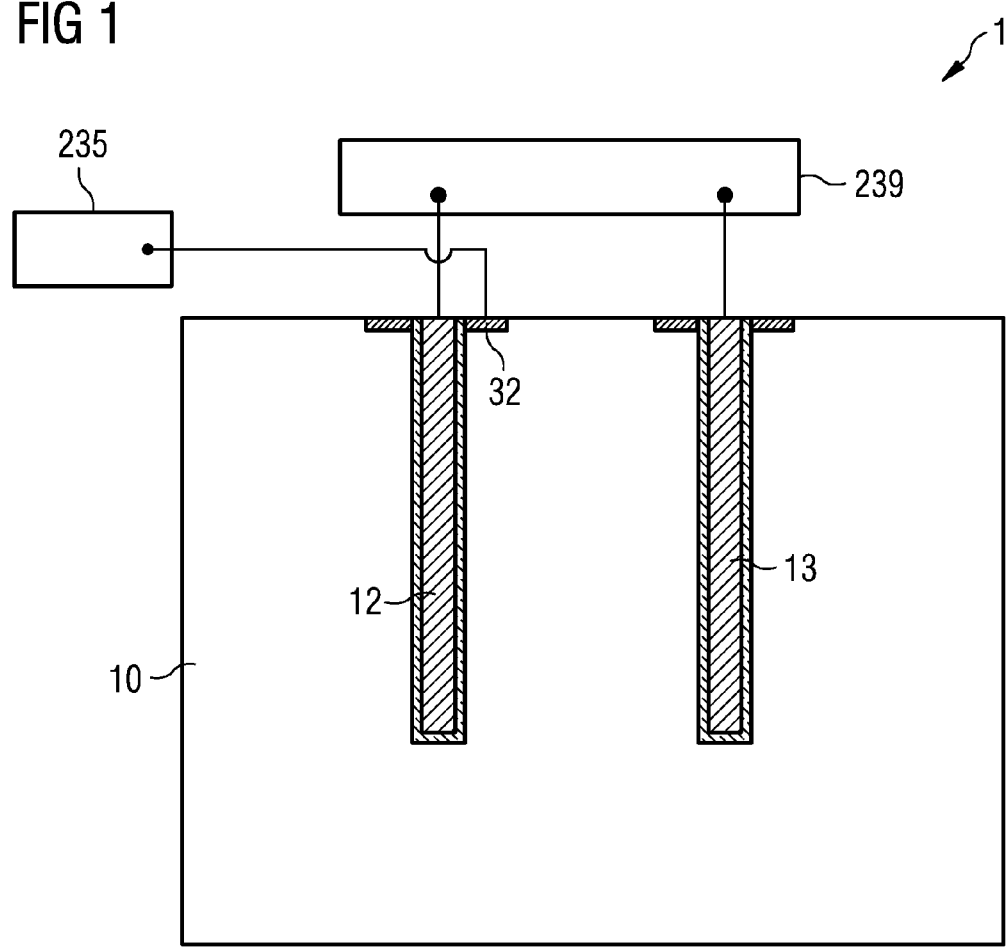
FIG. 1 shows a schematic cross-section of an imaging circuit according to an embodiment.

FIG. 1 shows a schematic cross-section of an imaging circuit 1 according to an embodiment.

The imaging circuit 1 includes a semiconductor substrate 10 and a first vertical trench gate 12 and a neighboring second vertical trench gate 13 extending into the semiconductor substrate 10.

The imaging circuit 1 further includes a gate control circuit 239. The gate control circuit 239 operates in a first operating mode to provide a first voltage, e.g. V1, to the first vertical trench gate 12 and a second voltage, e.g. V2, to the second vertical trench gate 13 to generate a first space charge region accelerating photogenerated charge carriers of a first charge-carrier type to a first collection contact 32 in proximity to the first vertical trench gate 12.

The gate control circuit 239 further operates in a second operating mode to provide a third voltage to the first vertical trench gate 12 to generate a second space charge region accelerating photogenerated charge carriers of the first charge-carrier type to the first collection contact 32 in proximity to the first vertical trench gate 12.

The imaging circuit 1 further includes an image processing circuit 235 which determines distance information of an object based on photogenerated charge carriers of the first charge carrier type collected at the first collection contact 32 in the first operating mode and color information of the object based on photogenerated charge carriers of the first charge carrier type collected at the first collection contact 32 in the second operating mode.

Due to the above implementation of the image processing circuit 235, the gate control circuit 239, the first vertical trench gate 12 and the second vertical trench gate 13, an imaging circuit enables the generation of three-dimensional images, color images and three-dimensional color images, which show a detailed picture of a surrounding scenery and color recognition. Furthermore, both distance information and color information of an object may be determined by the same imaging circuit. Furthermore, an image which has both distance information and a color information about an object may be produced by the imaging circuit 1. Furthermore, due to the use of vertical trench gates for generating space charge regions, the lateral dimensions of the imaging circuit 1 may be reduced or the resolution may be increased and noise caused by stray charge-carriers may be avoided or minimized.

The semiconductor substrate 10 may be a silicon-based semiconductor substrate, a silicon carbide-based semiconductor substrate, a gallium arsenide-based semiconductor substrate or a gallium nitride-based semiconductor substrate. The semiconductor substrate 10 may be doped so that the majority charge-carriers of the semiconductor substrate are positive charge-carriers, e.g. holes, or so that the majority charge-carriers of the semiconductor substrate are negative-charge carriers, e.g. electrons. For the purposes of illustration, semiconductor substrate 10 is assumed to be a p-doped semiconductor substrate. In other words, it is assumed that the majority of charge carriers in semiconductor substrate 10 are positive charge carriers, i.e. holes.

For example, semiconductor substrate 10 may have a doping concentration between $1 \times 10^{13}$ to $1 \times 10^{17}$ cm$^{-3}$, or between $1 \times 10^{14}$ to $1 \times 10^{16}$ cm$^{-3}$, or $1 \times 10^{14}$ to $1 \times 10^{15}$ cm$^{-3}$, for example about $5 \times 10^{14}$ cm$^{-3}$.

The semiconductor substrate 10 may be a semiconductor die or semiconductor chip, for example. The first vertical trench gate 12 and the second vertical trench gate 13 may be formed in the semiconductor substrate 10, i.e. in the semiconductor die. The semiconductor substrate 10 may have a thickness measured in a vertical direction between a top side and a bottom side of the semiconductor substrate.

The first vertical trench gate 12 may be located in a first vertical trench 218 (shown in FIG. 2) and insulated from the semiconductor substrate 10 by an insulating layer 216 (shown in FIG. 2) inside the first vertical trench 218. For example, the first vertical trench 218 may be formed at the top side 101 of semiconductor substrate 10, for example, by structuring the top side 101 of semiconductor substrate, and the first vertical trench 218 may extend into the semiconductor substrate 10 from the top side 101.

Subsequently, an insulating layer 216 may be deposited in the first vertical trench 218 and may cover the bottom wall and sidewalls of the first vertical trench 218. The insulating layer 216 may be an oxide layer for example. For example, the insulating layer 216 may be a silicon dioxide layer. The insulating layer 216 may have a thickness between 1 nm to 30 nm, or between 2 nm to 25 nm, or between 5 nm to 25 nm, e.g. about 20 nm.

The insulating layer 216 may also be referred to as a gate oxide layer or oxide liner. The first vertical trench gate 12 may be formed by depositing an electrically conductive material in the first vertical trench 218. The electrically conductive material may fill the first vertical trench 218, for example, and may be formed over, e.g. directly over the insulating layer 216. The electrically conductive material may be polysilicon, and/or a metal, for example. The insulating layer 216 may insulate the first vertical trench gate 12 from the semiconductor substrate 10.

The second vertical trench gate 13 may be implemented according to the implementation of the first vertical trench gate 12.

The first collection contact 32 may include a local n-doped region (shown in FIGS. 4A to 4D) formed at the top surface of the semiconductor substrate 10, and a metallic contact formed over the n-doped region, for example. For example, the first collection contact 32 may be an electrically conductive electrode material deposited over an n-doped implant region. The first collection contact 32 may be in direct electrical connection with the n-doped implant region, or may be electrically connected to the n-doped implant region through one or more electrically conductive layers. The first collection contact 32 and the n-doped implant region may be formed at the top side 101 of semiconductor substrate 10 in proximity to the first vertical trench gate 12. For example, the n-doped implant region may be formed in the semiconductor substrate 10 at the surface of the top side 101, and the first collection contact 32 may be formed over the n-doped implant region, e.g. over the top side 101 of the semiconductor substrate 10. For example, the first collection contact 32 and the n-doped implant region may surround the first vertical trench gate 12. For example, the first collection contact 32 and/or the n-doped implant region may be adjacent or directly adjacent to the insulating layer 216 of the first vertical trench gate 12. For example, the first collection contact 32 and the n-doped implant region may at least partially or fully surround, e.g. they may at least partially or fully wrap around, the first vertical trench gate 12.

The first collection contact 32 may be electrically connected to the image processing circuit 235. The first collection contact 32 may provide photogenerated electric signals related to photogenerated charge carriers collected at the first collection contact 32. The photogenerated charge carriers collected at the first collection contact 32 may be generated at least by the first voltage V1 and the third voltage V3 applied by the gate control circuit 239 to the first vertical trench gate 12, and/or may be photogenerated charge carriers arriving at the first collection contact 32 due to diffusion from a concentrations gradient, for example. The provided photogenerated electric signals may be transmitted to the image processing circuit 235 for evaluation. The image processing circuit 235 may receive the photogenerated electric signals related to the photogenerated charge carriers. The photogenerated electric signals may be a photocurrent, or a voltage signal, for example.

The first space charge region and the second space charge region may be space charge regions generated at different times. The first space charge region and the second charge region may be generated by applying same or different voltages and may extend through the same parts or different parts of the semiconductor substrate.

In the first operating mode, desired distance information about an object may be determined by the image processing circuit 235 of the imaging circuit 1. For example, it may be desired that a three-dimensional image of the object be produced by the imaging circuit 1.

The object may be a thing, a scenery or a person, for example. The object may be three-dimensional and have color, for example.

In the first operating mode, an illumination source may emit electromagnetic waves having a first wavelength of interest in the vicinity of an object, e.g. towards the object. The electromagnetic waves having the first wavelength of interest may be emitted by the illumination source and modulated at a modulation frequency, f. The emitted electromagnetic waves having the first wavelength of interest may be reflected by the object and received by the imaging circuit 1. In order to determine distance information of the object, a phase correlation between the electromagnetic waves having the first wavelength of interest and its reflected signal may be evaluated by the imaging circuit 1.

Assuming that the semiconductor substrate 10 is a p-doped semiconductor substrate, the first voltage V1, may be a positive bias voltage and the second voltage V2, may be a zero voltage, i.e. no bias, for example. It may be understood that other bias voltages for V1 and V2 may be selected so that a potential difference exists between V1 and V2. The biasing frequency at which voltages V1 and V2 are alternately applied to first vertical trench gate 12 and second vertical trench gate 13 may be locked to the frequency, f, of the signal to be detected (e.g. electromagnetic waves with a wavelength of interest reflected by the object).

The provision of the first voltage V1, to the first vertical trench gate 12 and the second voltage V2, to the second vertical trench gate 13 may generate the first space charge region within the semiconductor substrate 10.

Due to the implementation of the gate control circuit 239 with the first vertical trench gate 12 and the second vertical trench gate 13, a reduction of noise may be achieved. Through the use of vertical trench gates, a space charge region may be generated so that electron hole pairs, generated by infra-red light at least partly outside the space charge region at moderate substrate doping levels, which contribute to noise, may be avoided. Besides the reduction of noise, much smaller lateral dimensions compared to photonic mixer devices may be achieved.

In the first operating mode, the image processing circuit 235 may determine distance information of an object based on photogenerated charge carriers of the first charge carrier type 16 collected at the first collection contact 32 during the first time interval and photogenerated charge carriers of the first charge carrier type 16 collected at the second collection contact 33 in proximity to the second vertical trench gate 13 during the second time interval. In order to calculate the phase delay of the electromagnetic waves having the first wavelength, the image processing circuit 235 may compare the charge amount gathered at first vertical trench gate 12 and second vertical trench gate 13. In the first operating mode, the image processing circuit 235 may execute algorithms, for example, pulsed-width modulation or continuous wave modulation calculations used in TOF phase-detection.

In the embodiments described above, semiconductor substrate 10 is assumed to be a p-doped semiconductor substrate. It may be understood that in other embodiments, semiconductor substrate 10 may not be limited to being a p-doped semiconductor substrate and may instead be an n-doped semiconductor substrate. In these other embodiments, the configurations may be reversed. For example, the doping of the first collection contact 32 and second collection contact 33 may be reversed, e.g. from n-doping to p-doping. For example, the doping of the bulk contact may be reversed, e.g. from p-doping to n-doping. For example V1 may be a negative bias rather than positive bias. For example V2 may be a positive bias or zero. For example, the first charge-carrier type 16 may be positive charge-carriers, e.g. holes, and the second charge-carrier type 17 may be negative charge-carriers, e.g. electrons.

Due to the implementation, (e.g. the gate control circuit 239 with the first vertical trench gate 12, the second vertical trench gate 13, the first collection contact 32 and the second collection contact 33) the imaging circuit 1 may be implemented as a phase sensitive photocell for fast capture cycles wherein electrons may be collected at the trench gate surface and then extracted from the device by a local contact close to the trench while holes may be rejected to the bulk and collected by a substrate contact.

In the second operating mode, desired color information about the object may be determined by the image processing circuit 235 of imaging circuit 1. The image processing circuit 235 may determine color information of a plurality of color information types of the object based on the photogenerated charge carriers generated by the plurality of different voltages, and may produce a color image of the object based on the color information of the plurality of color information types.

For example, the plurality of color information types may be based on intensity/amplitude information of the photogenerated charge carriers based on the spectral sensitivity of the image circuit to a plurality of wavelengths of interest, e.g. red light or green light or blue light. It may be understood that the number of color information types of the plurality of color information types is not limited to three, and may include any integer number greater than one. Further, it may be understood that the spectral sensitivity of the image circuit may not be limited to red light or green light or blue light, but may include any number of colors which is more than one.

Figure 2:
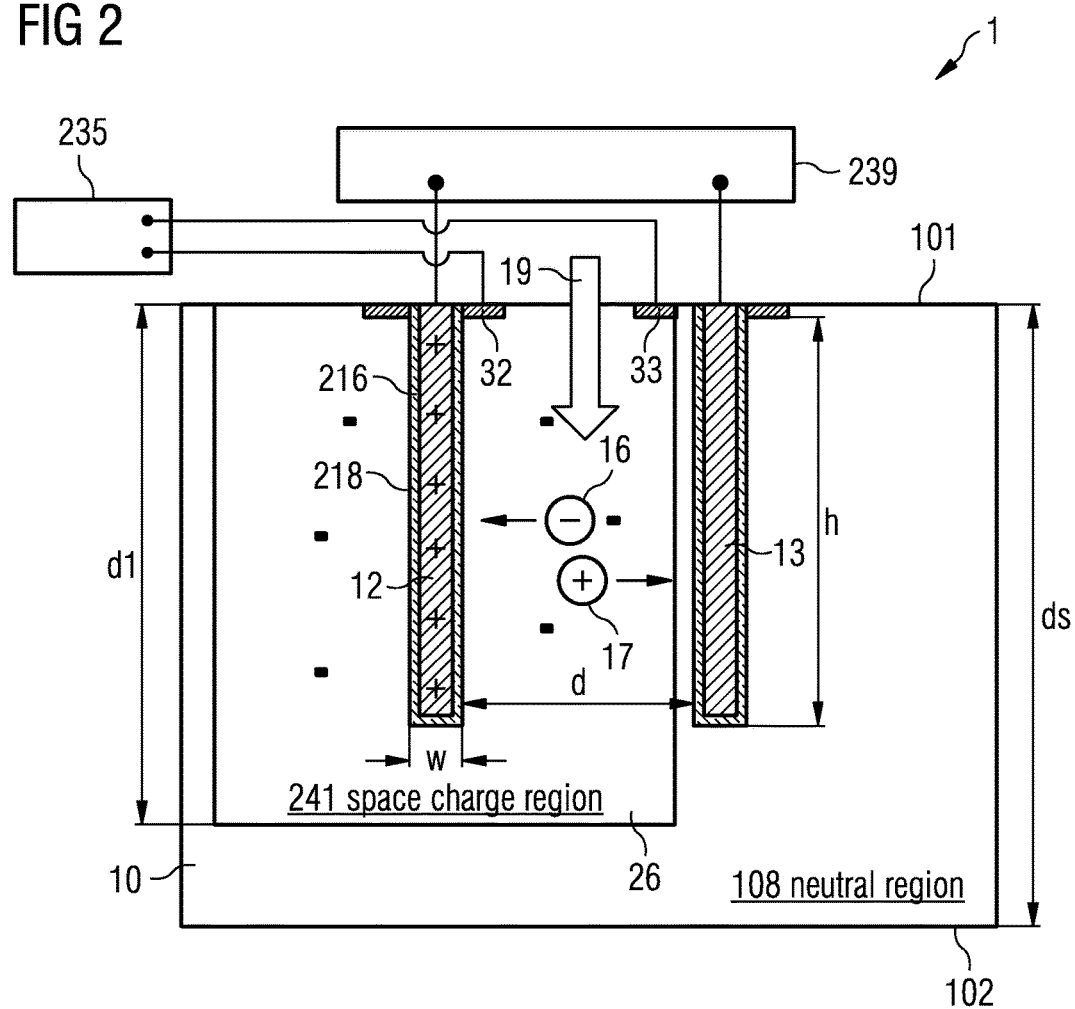
FIG. 2 shows a schematic cross-section of an imaging circuit operating in a first operating mode according to an embodiment.

FIG. 2 shows a schematic illustration of an imaging circuit 2 operating in the first operating mode. The imaging circuit 2 may include one or more or all of the features already described with respect to imaging circuit 1.

The first vertical trench gate 12 may be located in a first vertical trench 218 and insulated from the semiconductor substrate 10 by an insulating layer 216 inside the first vertical trench 218. For example, the first vertical trench 218 may be formed at the top side 101 of semiconductor substrate 10, for example, by structuring the top side 101 of semiconductor substrate, and the first vertical trench 218 may extend into the semiconductor substrate 10 from the top side 101.

The first vertical trench gate 12 and the second vertical trench gate 13 may extend more than 5 µm into the semiconductor substrate 10. For example, vertical height, h, of the first vertical trench gate 12 and the second vertical trench gate 13 may be between 5 µm to 500 µm, or between 10 µm to 300 µm, or between 10 µm to 100 µm, e.g. 70 µm. The first vertical trench gate 12 and the second vertical trench gate 13 may extend to the same or similar depths, though this may vary in other embodiments.

The first vertical trench gate 12 and the second vertical trench gate 13 may each have a width, w, (e.g. minimal or average extensions in one direction) ranging between 0.1 µm to 5 µm, or between 0.1 µm to 4 µm, or between 0.1 µm to 2 µm, e.g. 1 µm.

The semiconductor substrate 10 may have a thickness, ds, measured in a vertical direction between a top side and a bottom side of the semiconductor substrate 10. Examples of possible semiconductor substrate thicknesses may be, but or not limited to being between 400 µm to 1 mm, or between 500 µm to 900 µm, or between 600 µm to 850 µm.

Figure 3:
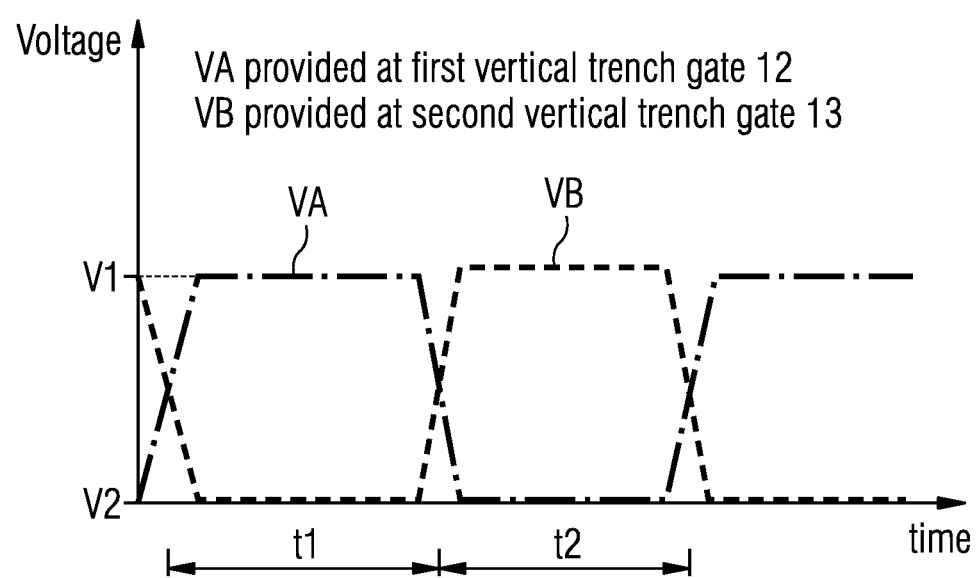
FIG. 3 shows a diagram indicating voltages provided by a gate control circuit in a first operating mode according to an embodiment.

During a first time interval, t1, of the first operation mode, the gate control circuit 239 may provide the first voltage V1, to the first vertical trench gate 12 and the second voltage V2, to the second vertical trench gate 13 (as shown in FIG. 3). The provision of the first voltage V1, to the first vertical trench gate 12 and the second voltage V2, to the second vertical trench gate 13 may be carried out simultaneously.

The electromagnetic waves having the first wavelength of interest reflected by the object may be received by imaging circuit 1. The electromagnetic waves having the first wavelength may impinge upon imaging circuit 1 and may enter the electromagnetic wave receiving area 26 within the semiconductor substrate 10. Arrow 19 (shown in FIG. 2) illustrates the entry of electromagnetic waves having the first wavelength impinging upon and entering an imaging circuit, e.g. imaging circuit 1, from a top side 101 of the semiconductor substrate 10, for example. It may be understood that in other alternative embodiments, the entry of electromagnetic waves having the first wavelength may be from a bottom side 102 of the semiconductor substrate 10. The entry of electromagnetic waves having the first wavelength into the first space charge region 241 may lead to the generation of photogenerated charge carriers, i.e. electron hole pairs, which include a first charge-carrier type 16, e.g. electrons, and a second charge-carrier type 17, e.g. holes.

During the first time interval, t1, while the first voltage V1, is being provided to the first vertical trench gate 12 and the second voltage V2, is being provided to the second vertical trench gate 13, the first space charge region accelerates photogenerated charge carriers of the first charge-carrier type 16, e.g. electrons, to the first collection contact 32 in proximity to the first vertical trench gate 12. Photogenerated charge carriers of the first charge-carrier type 16 may also arrive at the first vertical trench gate 12 due to diffusion by a concentration gradient and may also be collected by the first collection contact 32, for example. Further, the first space charge region accelerates photogenerated charge carriers of the second charge-carrier type 17, e.g. holes, to a bulk contact connected to the semiconductor substrate and/or a second collection contact in proximity to the second vertical trench gate 13. The first space charge region may form around the first vertical trench gate 12 while the second vertical trench gate 13 may remain in a neutral region of the semiconductor substrate 10.

Applying voltages V1 and V2 to the vertical trench gates 12 and 13 respectively, causes the first space charge region 241 to spread out horizontally, (parallel to the device surface or top side 101). The separation distance, d, between the first vertical trench gate 12 and the second vertical trench gate 13 may be linked to the substrate doping level, for example, so that its operation as a TOF phase-sensitive detector may generate a fully depleted gap between the first vertical trench gate 12 and the second vertical trench gate 13, for example.

For example, the separation distance, d, may be between 0.5 µm to 10 µm or between 1 µm to 5 µm or between 1 µm to 3 µm, e.g. about 1 µm. The spreading distance of the space charge region 241 from the first vertical trench gate 12 may be between 0.5 µm to 10 µm or between 1 µm to 5 µm or between 1 µm to 3 µm, e.g. about 1 µm, but may be less than the separation distance d, so that the second vertical trench gate 13 remains in the neutral region 108.

The first space charge region 241 may also spread out vertically, (perpendicular to the semiconductor substrate surface or top side 101). The depth, d1, of the space charge region 241 may be between 5 µm to 500 µm, or between 10 µm to 300 µm, or between 10 µm to 100 µm. The depth of the space charge region 241 depends on the height of the vertical trench gate, the applied gate voltage and/or the doping level, and may be slightly larger than the height of the vertical trench gate due to vertical spreading, for example.

The photogenerated charge carriers of first charge-carrier type 16 (electrons) may be accelerated towards the first vertical trench gate 12 due to the applied (positive) bias at the first vertical trench gate 12 and collected at the first collection contact 32 during the first time interval, t1 in the first operating mode. The photogenerated charge carriers of the second charge-carrier type 17 (holes) may be collected at a bulk contact 36 (shown in FIG. 5) and/or a second collection contact at the second vertical trench gate 13. The photogenerated carriers of the second charge-carrier type 17 may be rejected to the bulk of semiconductor substrate 10 and collected by the bulk contact, for example. Analogously, when the alternate biasing is provided during the second time interval, t2, of the first operating mode, photogenerated charge carriers of the first charge-carrier type 16 may be accelerated towards the second vertical trench gate 13 and photogenerated charge carriers of the second charge-carrier type 17 may be accelerated towards the first vertical trench gate 12.

In the first time interval of the first operating mode, the distance between the first vertical trench gate 12 and the second vertical trench gate 13 may be chosen so that the first vertical trench gate 12 is surrounded by the first space charge region 241, whereas the second vertical trench gate 13 remains in the neutral region 108 of the semiconductor substrate 10, for example. The neutral region 108 (shown in FIG. 2) of the semiconductor substrate 10 may be a region which has similar electrical properties (e.g. concentration of free charge carriers while applying the same voltage to the vertical trench gate and bulk) to the bulk of the semiconductor substrate 10. Analogously, when an alternate bias is applied in the second time interval of the first operating mode, the distance between the first vertical trench gate 12 and the second vertical trench gate 13 may be chosen so that the second vertical trench gate 13 is surrounded by the second space charge region, whereas the first vertical trench gate 12 remains in the neutral region of the semiconductor substrate 10, for example.

For example, a pixel element of the imaging circuit may be a photocell with at least two trench gates that operate in depletion mode with a fixed frequency in a first operating mode, for example. This frequency is locked to the frequency of a signal sent, thus a phase correlation between the light pulse and its reflection may be evaluated. By using a trench gate, the space charge region may spread out horizontally (parallel to the device surface) in deep depletion, as the depletion width is larger than the maximum depletion width under equilibrium for example.

The space between two adjacent electrodes may be linked to the substrate doping level in a way that the operation as a TOF device forces a fully depleted gap between the trenches. The depth of the trench gate may be adapted to the light wavelength used as the signal source, i.e. it may be in the range of several tens of microns.

For example, in the first operation mode, the imaging device 1 may be used as a phase sensitive detector, and the electrodes of adjacent trenches, e.g. first 12 and second 13 vertical trench gate, are biased alternately with a positive (fast sweep), so that the imaging device 1 operates in the deep depletion state. A readout circuitry may be then used to compare the charge amount gathered at the electrodes, read out by a local n-doped region and contact close to the trench. For example, the imaging device 1 may operate similarly to a photonic mixer devices in the first operation mode.

This alternating bias is illustratively shown in FIG. 3, which shows a diagram indicating voltages provided by a gate control circuit in a first operating mode.

At least a part of the photogenerated charge carriers of the first charge-carrier type 16 accelerated during the first time interval of the first operating mode may be generated by electromagnetic waves having the first wavelength of interest. Furthermore, at least a part of the photogenerated charge carriers of the second charge-carrier type 17 accelerated during the second time interval of the first operating mode may be generated by the electromagnetic waves having the first wavelength of interest.

A readout circuitry may convert the intensity/amplitude information generated by the photo-generated charge carriers collected at first collection contact 32 and a bulk contact into an electrical signal, e.g. a current signal or a voltage signal or resistance signal. The readout circuitry may connect each of the first collection contact 32 and the bulk contact to the image processing circuit 235 which receives the electrical signal.

The gate control circuit 239 may provide the first voltage V1, to the first vertical trench gate 12 so that the first space charge region 241 extends at least into a depth, d1, of the semiconductor substrate 10 so that photogenerated charge carriers generated by the electromagnetic waves having the first wavelength of interest are generated in the first space charge region 241. The first voltage V1 for controlling the depth d1 of the first space charge region 241 may be based on a penetration depth of electromagnetic waves having the first wavelength of interest from a top side 101 of the semiconductor substrate 10 in accordance with the Beer-Lambert Law. The penetration depth may be defined as the depth from a top side 101 or surface of the semiconductor substrate at which the intensity of the electromagnetic waves penetrating the semiconductor substrate decreases to about 1/e (e.g. approximately 0.367) of the intensity of the electromagnetic waves entering the semiconductor substrate at the top side 101 or surface. For example, the first voltage V1 for controlling the depth d1 of the first space charge region 241 may be selected so that a predetermined percentage (e.g. greater than about 80%, 90% or 95%) or a majority (e.g. greater than about 50%) of photogenerated charge carriers generated by the electromagnetic waves having the first wavelength of interest entering the semiconductor substrate 10 are generated within the first space charge region 241. In this illustrative example, electromagnetic waves having the first wavelength of interest may be infra-red electromagnetic waves. For example, if the first wavelength of interest is about 800 nm, the penetration depth of 800 nm wavelength EM waves in a silicon substrate may be about 11.8 µm. A predetermined percentage or a majority of photogenerated charge carriers generated by the electromagnetic waves may be generated within a depth of about 11.8 µm, and the first space charge region 241 may extend at least into a depth, d1 of that region, for example at least or greater than 11.8 µm.

Furthermore, the height of the first and second vertical trench gates 12, 13 may be structured so that the depth of space charge regions generated by the first and second vertical trench gates 12, 13 may extend at least into a depth within which a predetermined percentage or a majority of charge carriers generated by a particular wavelength of interest are generated. For example, the depth, i.e. vertical height, h, of the first vertical trench gate 12 and the second vertical trench gate 13 may be adapted to be based on a penetration depth of the first wavelength of interest, i.e. the light wavelength used as the signal source. The first vertical trench gate 12 and the second vertical trench gate 13 may extend several tens of micrometers into the semiconductor substrate, for example.

During a subsequent second time interval, t2, the voltages applied to first vertical trench gate 12 and the neighboring second vertical trench gate 13 may be reversed, as shown in FIG. 3. Therefore, during the subsequent second time interval, the gate control circuit 239 may provide the second voltage V2, to the first vertical trench gate 12 and the first voltage V1, to the second vertical trench gate 1.

Providing the second voltage V2, to the first vertical trench gate 12 and the first voltage V1, to the second vertical trench gate 13 generates a third space charge region which accelerates photogenerated charge carriers of the first charge-carrier type 16, e.g. electrons, to a second collection contact 33 (shown in FIG. 2) in proximity to the second vertical trench gate 13. Furthermore, the third space charge region additionally accelerates photogenerated charge carriers of the second charge-carrier type 17, e.g. holes, to the bulk contact, or another bulk contact, connected to the semiconductor substrate 10, e.g. at a back side of the semiconductor substrate. In other words, with the configuration reversed, i.e., third space charge region may form around the second vertical trench gate 13 while the first vertical trench gate 12 remains in a neutral region of the semiconductor substrate 10.

A readout circuitry may convert the data generated by the photo-generated charge carriers collected at the second collection contact 33 and the bulk contact into an electrical signal, e.g. a current signal or a voltage signal or resistance signal. The readout circuitry may be connected to the image processing circuit which receives the electrical signal.

More details and aspects are mentioned in connection with embodiments described above or below (e.g. regarding semiconductor substrate, first vertical trench gate, second vertical trench gate, gate control circuit and image processing circuit). The embodiment shown in FIG. 2 may comprise one or more optional additional features corresponding to one or more aspects mentioned in connection with the proposed concept or one or more embodiments described above (e.g. FIG. 1) or below, (e.g. FIG. 3, or 4A to 4D, 5 to 7, or 8A to 8B).

FIG. 3 shows a diagram indicating voltages provided by a gate control circuit in the first operating mode.

The gate control circuit is configured to apply the fast alternating bias of V1 and V2 to the first 12 and second 13 vertical trench gates alternatingly so that the a pixel element of the imaging circuit 1, 2 is in deep depletion during the first operations mode. For example, the alternating frequency may be between 50 Hz to 1 MHz, or between 100 Hz to 800 Hz, or between 200 Hz to 600 Hz, or any value between these values.

Voltage V1 may be between 1V to 15V, or between 2V to 12V, or between 5V to 10V, for example. Voltage V2 may be about zero volts (ground) or another reference potential, for example.

FIGS. 4A to 4D show a schematic cross-section of the imaging circuit 1 or 2 operating in the second operating mode.

In the second operating mode, the toggling gate voltage may be replaced by a gate voltage sweep, for example, which causes a change in charge carrier concentration at the trench channel region. By using this technique, a change in spectral response and hence a color recognition may be provided. An additional feature implemented for color recognition may be a channel region that progressively changes channel charges with increasing gate voltage. This may be provided by a gradually doped substrate region. This may also help to increase quantum efficiency by using a built-in field and may be used in PMD systems. Another approach would be a gate dielectric that is cone-shaped or changing in stoichiometric composition.

Due to the increasing or rising gate voltage, the channel region may be operated in accumulation, depletion and/or inversion. In the second operating mode, the first vertical trench gate 12 may operate in a plurality of different operating states to generate a plurality of different inversion zones within the semiconductor substrate. For example, the gate control circuit 239 may provide, in the second operating mode, a plurality of different voltages, e.g. V3, V4, V5 and/or more voltages, to the first vertical trench gate 12.

Voltages applied during the second operating mode, e.g. V3, V4, V5 may be between 1V to 15V, or between 2V to 12V, or between 5V to 10V. In some examples, the voltage in the second operating mode may be gradually swept from 1V to 15V, or from 2V to 12V, or from 5V to 10V. In other examples, the voltages V3, V4, V5 may be discretely selected values between 1V to 15V, or between 2V to 12V, or between 5V to 10V.

The voltages may be in order of increasing gate bias, for example. Each voltage of the plurality of different voltages may be provided to the first vertical trench gate 12 in succession (for example, one after the other) to generate a respective space charge region at the interface an inversion zone and the semiconductor substrate, and whose extension into the semiconductor substrate 10 increases with increasing gate bias, for example. Each space charge region may accelerate photogenerated charge carriers of the first charge-carrier type 16 to the first collection contact 32, for example.

FIG. 4A shows an accumulation region, e.g. channel region formed around the first vertical trench gate 12 having the same majority carriers as the semiconductor substrate 10, i.e. holes. The accumulation region may be generated due to the provision of a negative bias to the first vertical trench gate.

FIG. 4B shows illustratively the imaging circuit operating during a third time interval, t3. The gate control circuit 239 may provide the third voltage V3, to the first vertical trench gate 12 during the third time interval, t3. The provision of the third voltage V3, to the first vertical trench gate 12, may generate an inversion zone 22 in the semiconductor substrate 10. The inversion zone 22 may be generated by the provision of a suitable external potential to the first vertical trench gate 12. As the first vertical trench gate 12 is insulated from the semiconductor substrate 10 by the insulating layer 216, which functions as a gate dielectric, surface charge carriers accumulate in the semiconductor substrate 10 at the interface between the insulating layer 216 of the first vertical trench gate 12 and the semiconductor substrate 10, for example. The surface charge carriers in the inversion zone 22 have an opposite charge carrier type to the charge carrier type of the bulk doping of the semiconductor substrate 10, for example. Therefore, assuming that the semiconductor substrate 10 is a p-doped semiconductor, the application of a suitable positive bias to the first vertical trench gate generates the inversion zone 22 of electrons, for example.

During the third time interval, t3, the third voltage V3, provided by the gate control circuit 239 to the first vertical trench gate 12 may generate an inversion zone 22 which may extend into the semiconductor substrate 10, so that the second space charge region 24 (shown in FIG. 5) extends at least into a depth, d2, of the semiconductor substrate 10 within which a predetermined percentage or a majority of photogenerated charge carriers generated by the electromagnetic waves having the second wavelength of interest are generated.

For example, during the third time interval, t3, the inversion zone 22 may extend into the semiconductor substrate 10 to a depth which is about ⅓ to about ½ the height, h, of the first vertical trench gate 12 (further illustrated in FIG. 4B). In other words, the inversion zone 22 may be formed only at an upper part of first vertical trench gate 12.

As the light waves enter the electromagnetic wave receiving area 26, the provision of the voltage V3, may tune the imaging circuit to have a spectral sensitivity to electromagnetic waves having a second wavelength of interest. The provision of the voltage V3, may tune the depth of the second space charge region 24, so that the second space charge region extends at least into a depth, d2, of the semiconductor substrate 10 within which a predetermined percentage or a majority of photogenerated charge carriers generated by the electromagnetic waves having the second wavelength of interest are generated. For example, the third voltage V3 for controlling the depth d2 of the second space charge region 24 may be based on a penetration depth of electromagnetic waves having the second wavelength of interest from a top side 101 of the semiconductor substrate 10 in accordance with the Beer-Lambert Law. For example, the third voltage V1 for controlling the depth d2 of the second space charge region 24 may be selected so that a predetermined percentage (e.g. greater than about 80%, 90% or 95%) or a majority (e.g. greater than about 50%) of photogenerated charge carriers generated by the electromagnetic waves having the second wavelength of interest entering the semiconductor substrate 10 are generated within the second space charge region 24. For example, the depth, d2, of the second space charge region may be below 10 µm, or below 8 µm, or below 5 µm.

As the electromagnetic waves having the second wavelength of interest are electromagnetic waves in the visible spectrum, the electromagnetic waves having the second wavelength of interest have a smaller penetration depth than the electromagnetic waves having the first wavelength of interest, for example. Voltage V3, provided by the gate control circuit 239 to the first vertical trench gate may be selected in which depth of the second inversion zone 22 and hence the second space charge region 24 generated by voltage v3, in inversion mode is smaller than the depth of the first 241 and third space charge region generated by voltage v1 and voltage v2 in deep depletion. In other words, the first space charge region 241 and the second space charge region 24 may extend into the semiconductor substrate 10 by different depths.

The second space charge region 24 may accelerate photogenerated charge carriers of the first charge-carrier type, e.g. electrons, to the first collection contact 32 in proximity to the first vertical trench gate 12. At least a part of the photogenerated charge carriers of the first charge-carrier type accelerated during the second operating mode are generated by electromagnetic waves having the second wavelength of interest. The photogenerated charge carriers of the first charge carrier type are conducted along the inversion zone 22 from the depth of the semiconductor substrate 10 to the first collection contact 32 at the top side 101 of semiconductor substrate 10, where they may be provided to the image processing circuit for evaluation. The second space charge region 24 may accelerate photogenerated charge carriers of the second charge-carrier type, e.g. positively charged holes, to the bulk contact and may be provided to the image processing circuit 235 via the bulk contact.

The provision of the plurality of voltages, e.g. V3, V4, V5, by the gate control circuit 239 to the first vertical trench gate 12 in succession varies the depth of the inversion zone 22 and the extent of the space charge region 24, to create different spectral responses with different bias voltages. For example, V3, V4, and V5 may be provided to the first vertical trench gate 12 in step-wise or gradual increments, i.e. a gate voltage sweep, leading to an increase in the extension of the inversion zone and hence the extension of the space charge region 24 vertically into the semiconductor substrate 10.

FIG. 4C shows a schematic cross-section of imaging circuit operating in the second operating mode.

During a subsequent fourth time interval, t4, the gate control circuit 239 may be further configured to provide a fourth voltage V4, to the first vertical trench gate 12, in which the third voltage V3, and the fourth voltage V4, are different. The fourth voltage V4, provided by the gate control circuit 239 to the first vertical trench gate 12 during a fourth time interval generates an inversion zone 222 which extends deeper into the semiconductor substrate than the inversion zone 22 generated with applied voltage bias V3, shown in FIG. 4B. The inversion zone 222 may be formed at an upper part and middle part of first vertical trench gate 12.

The voltage V4, provided by the gate control circuit 239 to the first vertical trench gate 12 may generate a second inversion zone 222 which may extend into the semiconductor substrate 10 so that the fourth space charge region extends at least into a depth, d3, of the semiconductor substrate 10 where a predetermined percentage or a majority of photogenerated charge carriers are generated by the electromagnetic waves having a third wavelength of interest. For example, during the fourth time interval, t4, the second inversion zone 222 may extend into the semiconductor substrate 10 to a depth which is about ½ to about ¾ the height, h, of the first vertical trench gate 12.

As the light waves enter the electromagnetic wave receiving area 26, the provision of the voltage V4, may tune the imaging circuit to have a spectral sensitivity to electromagnetic waves having a third wavelength of interest. The provision of the voltage V4 may tune the depth of the fourth space charge region, so that the fourth space charge region extends at least into a depth, d3 of the semiconductor substrate 10 within which a predetermined percentage or a majority of photogenerated charge carriers generated by the electromagnetic waves having the third wavelength of interest are generated. For example, the voltage V4 for controlling the depth d3 of the fourth space charge region may be based on a penetration depth of electromagnetic waves having the third wavelength of interest from a top side 101 of the semiconductor substrate 10. For example, the voltage V4 for controlling the depth d3 of the fourth space charge region may be selected so that a predetermined percentage (e.g. greater than about 80%, 90% or 95%) or a majority (e.g. greater than about 50%) of photogenerated charge carriers generated by the electromagnetic waves having the third wavelength of interest entering the semiconductor substrate 10 are generated within the fourth space charge region. For example, the depth, d3, of the fourth space charge region may be below 10 µm, or below 8 µm, or below 5 µm.

The electromagnetic waves having the third wavelength of interest may have a larger penetration depth than the electromagnetic waves having the second wavelength of interest.

Voltage V4, provided by the gate control circuit 239 to the first vertical trench gate may be selected in which depth, d3, of the second inversion zone 222 and hence the fourth space charge region generated by voltage V4 is larger than the depth of the inversion zone 22 and hence the second space charge region generated by voltage V3.

Similarly, the fourth space charge region accelerates photogenerated charge carriers of the first charge-carrier type, e.g. electrons, to the first collection contact 32 in proximity to the first vertical trench gate 12. The photogenerated charge carriers of the first charge carrier type are conducted along the second inversion zone 222 from the depth of the semiconductor substrate 10 to the first collection contact 32 at the top side 101 of semiconductor substrate 10, where they may be provided to the image processing circuit for evaluation. Photogenerated charge carriers of the second charge-carrier type may be collected at the second collection contact 33 provided to the image processing circuit.

It may be understood therefore that in the second operating mode, the imaging circuit may operate in a plurality of operating states, in which in each of the plurality of operating states, the extent to which the inversion zone 22, 222, 223 penetrates into the depth of the semiconductor substrate 10 may be varied. The depth of the inversion zones in each of the operating states may be adjusted discretely or gradually. The discrete or gradual adjustability or variation of the extension of the inversion zone is indicated in FIG. 4 by an arrow 23.

FIG. 4D shows for example, the provision of a fifth voltage V5, by the gate control circuit 239 to the vertical trench gate 12. The fifth voltage V5, may generate a third inversion zone 223 which may extend to approximately the full depth of the first vertical trench gate 12 during the fifth time interval. In other words Voltage V5, provided by the gate control circuit 239 to the first vertical trench gate 12 may be selected in which depth of the third inversion zone 223 and hence the fifth space charge region generated by voltage V5 is larger than the depth of the second inversion zone 222 and hence the fourth space charge region generated by voltage V4. The third inversion zone 223 may be formed along the whole of the first vertical trench gate 12.

The provision of the voltage V5 may tune the imaging circuit to have a spectral sensitivity to electromagnetic waves having a fourth wavelength of interest. The provision of the voltage V5 may tune the depth of the fifth space charge region, so that the fifth space charge region extends at least into a depth, d4 of the semiconductor substrate 10 within which a predetermined percentage or a majority of photogenerated charge carriers generated by the electromagnetic waves having the fourth wavelength of interest are generated. For example, the voltage V5 for controlling the depth of the fifth space charge region may be based on a penetration depth of electromagnetic waves having the fourth wavelength of interest in the semiconductor substrate 10. For example, the voltage V5 for controlling the depth of the fifth space charge region may be selected so that a predetermined percentage (e.g. greater than about 80%, 90% or 95%) or a majority (e.g. greater than about 50%) of photogenerated charge carriers generated by the electromagnetic waves having the fourth wavelength of interest entering the semiconductor substrate 10 are generated within the fifth space charge region. For example, the depth, d4, of the fifth space charge region may be below 10 µm, or below 8 µm, or below 5 µm.

The imaging circuit may further include a first collection contact 32 configured for providing the photogenerated charge carriers of a first charge carrier type. In the first operating state of the second operation mode, the first inversion zone 22 may be configured to selectively collect a first portion of the photogenerated charge carriers of the first charge carrier type and to conduct the collected first portion of the photogenerated charge carriers to the first collection contact 32. In the second operating state, the second inversion zone may be configured to selectively collect a second portion of the photogenerated charge carriers of the first charge carrier type and to conduct the collected second portion of the photogenerated charge carriers to the first collection contact 32.

The electromagnetic waves having the second, third or fourth wavelength of interest may be from light waves. The light waves, which may be from ambient light or a light emitting device, for example, may be reflected by the object of which a (three-dimensional) color image is to be taken. The light waves may include electromagnetic waves having wavelengths which lie within the visible spectrum, e.g. from about 380 nm to about 750 nm. The reflected light waves may include color information about the object, for example.

It may be understood that the wavelengths of interests described herein may be different from each other. For example, the first wavelength of interest and the second wavelength of interest may be different. For example, the first, second wavelength, third wavelength and fourth wavelengths may each be different from each other. The application of a specific voltage to the vertical trench gate may allow the imaging circuit to display a maximal spectral sensitivity to a particular wavelength of interest, or to a particular wavelength range, e.g. within the infra-red or visible spectrum, for example. The application of different voltage biases to the vertical trench gates may effectively tune the imaging circuit to have different spectral sensitivities to the different wavelengths of interest.

The implementation of spectral sensitivity in first vertical trench gate 12 has been shown illustratively with respect to FIGS. 4A to 4D. It may be understood however that the first vertical trench gate 12 may be controlled by the gate control circuit 235 not only individually, but simultaneously with a plurality of vertical trench gates formed in the semiconductor substrate 10. For example, in the second operating mode, the gate control circuit 239 may provide the third voltage V3, to the first vertical trench gate 12 and analogously also to the second vertical trench gate 13 during the third time interval to further generate a further space charge region accelerating photogenerated charge carriers of the first charge-carrier type 16 to a second collection contact 33 in proximity to the second vertical trench gate 13. Likewise, each successive voltage in the voltage sweep may be provided simultaneously to the plurality of vertical trench gates, for example, to the first vertical trench gate 12 and to the second vertical trench gate 13 and other vertical trench gates in the semiconductor substrate 10.

The plurality of vertical trench gates may form a photodetector array, in which each pixel element in the photodetector array includes at least one vertical trench gate. In the second operating mode, each pixel element of the photodetector array may produce color information about an object using a single vertical trench gate photodetector within the pixel element. In the first operating mode, a pair of neighboring pixel elements, e.g. first vertical trench gate 12 and second vertical trench gate 13 may produce distance information about the object using a pair of vertical trench gate photodetectors.

Subsequently, the image processing circuit 235 may generate image data of a three-dimensional color image of the object based on the distance information and the color information.

Other embodiments describe ways of generating an inversion zone which may extend discretely or gradually into the depth of the semiconductor substrate 10.

In one embodiment, the semiconductor substrate 10 may have a doping which gradually increases along the first vertical trench gate 12. For example, the semiconductor substrate 10 may have a doping which gradually increases vertically into the depth of the substrate, i.e. from the top side 101 towards the bottom side 102. For example, doping of the semiconductor substrate 10 is higher in proximity to the bottom of the first vertical trench gate 12 and the bottom of the second vertical trench gate 13 than the top side 101. This may lead to a higher voltage being required to be applied to the first vertical trench gate 12 in order to be able to create an inversion zone which extends to the bottom of the first vertical trench gate 12.

Alternatively, optionally or additionally, a thickness of the insulating layer 216 may increase into the semiconductor substrate 10. The insulating layer 216 may become thicker in the first vertical trench 216 with increasing depth into the semiconductor substrate 10. For example, the thickness of the insulating layer 216 may increase gradually with increasing depth into the semiconductor substrate 10 where the thickness of the insulating layer 216 at the bottom of the trench may be several times thicker than the thickness at the top of the trench, for example, two or more times thicker.

Alternatively, optionally or additionally, the insulating layer 216 may have a non-uniform stoichiometry. For example, the trench dielectric 216 may change its dielectric characteristics into the depth. This may be achieved by decreasing nitriding of the insulation layer 216 with increasing depth of the insulating layer 216 in the semiconductor substrate. For example, the magnitude of the electric field in the insulating layer 216 may be lower at the bottom of vertical trench 218 than at the top.

Due to the implementation of at least one of gradual doping of the semiconductor substrate, varying the thickness of the insulating layer 216 and a non-uniform stoichiometry of the insulating layer, the extension of the inversion zone 22 may be continuously and/or gradually adjustable and the spectral sensitivity of the photodetector may be continuously and/or gradually adjustable by applying different voltages. With the measures listed above, e.g. gradually doped substrate and/or cone-shaped and/or spatially modified stoichiometry of the gate dielectric, a trench gate TOF device may be used in parallel as a color sensing device. Furthermore, the color information may be obtained quickly, for example, a gate voltage sweep may take less than 1 ms.

Three or more (e.g. four, five, six or seven or more) different voltages may be applied to the first vertical trench gate to obtain different color information in less than 1 ms (or less than 100 ns, or less than 10 ns).

More details and aspects are mentioned in connection with embodiments described above or below (e.g. regarding semiconductor substrate, first vertical trench gate, second vertical trench gate, gate control circuit and image processing circuit). The embodiment shown in FIG. 4A to 4D may comprise one or more optional additional features corresponding to one or more aspects mentioned in connection with the proposed concept or one or more embodiments described above (e.g. FIGS. 1 to 3) or below (e.g. FIGS. 5 to 7, 8a to 8b).

FIG. 5 shows illustratively the imaging circuit 1 or 2 described with respect to FIGS. 1 to 3 and 4A to 4D) in an operating state of the second operating mode in greater detail. FIG. 5 shows the generation of a space charge region at the interface between an inversion zone and a semiconductor substrate. The space charge region may have a larger extension into the semiconductor substrate than the inversion zone. For example, due to the generation of the n-channel inversion zone 22 in the p-doped semiconductor substrate 10, the second space charge region 24 may be generated at the interface between the n-channel inversion zone 22 and the p-doped semiconductor substrate 10. The space charge region 24 has a larger extension into the semiconductor substrate 10 than the inversion zone 22, for example.

FIG. 5 shows the bulk contact 36 described above with respect to the embodiments of FIGS. 1 to 3 and 4A to 4D. The bulk contact 36 may be an electrically conductive electrode material deposited over a p-doped implant region. The bulk contact 36 may be formed in the semiconductor substrate 10 and in direct contact to the semiconductor substrate 10. For example, the bulk contact 36 and the p-doped implant region may be formed at the top side 101 of semiconductor substrate 10. The bulk contact 36 may be located within the neutral region 108, for example. For example, the bulk contact 36 may be located approximately halfway between first vertical trench gate 12 and second vertical trench gate 13.

Arrow 23 shows the direction (e.g. vertical direction) of the variation of depth of the inversion zone and hence of the space charge region in the semiconductor substrate 10, for example along the height of the vertical trench, when varying voltage biases are applied to the first vertical trench gate 12.

More details and aspects are mentioned in connection with embodiments described above or below (e.g. regarding semiconductor substrate, first vertical trench gate, second vertical trench gate, gate control circuit and image processing circuit). The embodiment shown in FIG. 5 may comprise one or more optional additional features corresponding to one or more aspects mentioned in connection with the proposed concept or one or more embodiments described above (e.g. FIGS. 1 to 3 or 4A to 4D) or below (e.g. 6 to 7 or 8a to 8b).

FIG. 6 shows a schematic cross-section of an imaging circuit according to an embodiment.

Imaging circuit 3 includes a semiconductor substrate 10 and a plurality of vertical trench gates 12, 13, 14, extending into the semiconductor substrate 10. Each respective vertical trench gate has a corresponding collection contact 32, 33, 34 in its proximity for collecting photogenerated charge carriers of a first charge-carrier type.

The imaging circuit 3 includes a gate control circuit 239 configured to provide each of the plurality of vertical trench gates with a different voltage during a collection time interval, tc.

Each respective vertical trench gate generates a respective space charge region for accelerating photogenerated charge carriers of the first charge-carrier type to its respective collection contact.

The imaging circuit 3 further includes an image processing circuit 235 configured to determine color information of a plurality of color information types of an object. The color information of each color information type may be based on photogenerated charge carriers of the first charge carrier type collected at each corresponding collection contact 32.

Due to the above implementation, each of the vertical trench gates may be tuned so that each vertical trench gate has a different spectral sensitivity from the other during the same collecting time interval, tc. This allows the imaging circuit 3 to acquire and produce color information of a plurality of color information types about an object quickly.

For example, in an embodiment, the gate control circuit 239 may be configure to provide a voltage V3, to the first vertical trench gate 12 and voltage V4 to neighboring second vertical trench gate 13 and/or voltage V5 to a further neighboring third vertical trench gate 14 simultaneously, i.e. within the same collection time interval, tc. Therefore, the first vertical trench gate 12, second vertical trench gate 13 and the third vertical trench gate 13 may each have a different spectral sensitivity from other. For example, assuming that voltages V3, and V4 and V5 are increasing voltage biases, first vertical trench gate 12 with applied voltage bias V3, may have a spectral sensitivity to a shorter wavelength than second vertical trench gate 13 with applied voltage bias V4. Similarly, second vertical trench gate 13 with applied voltage bias V4 may have a spectral sensitivity to a shorter wavelength than third vertical trench gate 14 with applied voltage bias V5. For example, during the same collection time interval, tc, first vertical trench gate 12 may have a spectral sensitivity to blue light, second vertical trench gate 13 may have a spectral sensitivity to green light and third vertical trench gate 14 may have a spectral sensitivity to red light.

It may be understood that the plurality of vertical trench gates may refer to any integer number of vertical trench gates greater than one which may each be used to detect color information about the object. For example, the plurality of vertical trench gates referred to in FIG. 6 may be a subset of the total number of vertical trench gates in the imaging circuit 3, and the imaging circuit 3 may include a plurality of such a subset.

For example, the imaging circuit 3 may include an array of vertical trench gates organized in groups (or subsets) of vertical trench gates. Each group of vertical trench gates may include a plurality of vertical trench gates, e.g. 12, 13, 14) provided with the different voltages.

The image processing circuit 235 may determine the color information of the plurality of color information types of the object for each group of vertical trench gates.

The operating modes described with respect to FIG. 6 may further be provided by the gate control circuit 239 in addition or alternatively to the first operating mode and/or the second operating mode already described above.

More details and aspects are mentioned in connection with embodiments described above or below (e.g. regarding semiconductor substrate, first vertical trench gate, second vertical trench gate, gate control circuit and image processing circuit). The embodiment shown in FIG. 6 may comprise one or more optional additional features corresponding to one or more aspects mentioned in connection with the proposed concept or one or more embodiments described above (e.g. FIGS. 1 to 3, or 4A to 4D, or 5) or below (e.g. FIG. 7, or 8A to 8B.).

FIG. 7 shows a flow chart of a method 700 for operating an imaging circuit. The method 700 includes providing 710, in a first operating mode, a first voltage to a first vertical trench gate and a second voltage to a second vertical trench gate to generate a first space charge region accelerating photogenerated charge carriers of a first charge-carrier type to a first collection contact in proximity to the first vertical trench gate.

The method 700 further includes providing 720, in a second operating mode, a third voltage to the first vertical trench gate to generate a second space charge region accelerating photogenerated charge carriers of the first charge-carrier type to the first collection contact in proximity to the first vertical trench gate.

The method 700 further includes determining 730 distance information of an object based on photogenerated charge carriers of the first charge carrier type collected at the first collection contact in the first operating mode.

The method 700 further includes determining 740 color information of the object based on photogenerated charge carriers of the first charge carrier type collected at the first collection contact in the second operating mode.

Due to the implementation of providing in a first operating mode a first voltage to the first vertical trench gate and a second voltage to the second vertical trench gate, and providing in a second operating mode a third voltage to the first vertical trench gate, both distance information and color information of an object may be determined by the same imaging circuit. Furthermore, an image which has both distance information and a color information of an object may be produced by the imaging circuit.

More details and aspects are mentioned in connection with embodiments described above or below (e.g. regarding semiconductor substrate, first vertical trench gate, second vertical trench gate, gate control circuit and image processing circuit). The embodiment shown in FIG. 7 may comprise one or more optional additional features corresponding to one or more aspects mentioned in connection with the proposed concept or one or more embodiments described above (e.g. FIGS. 1 to 3, or 4A to 4D, or 6) or below to (FIGS. 8A to 8B).

Figure 8A:
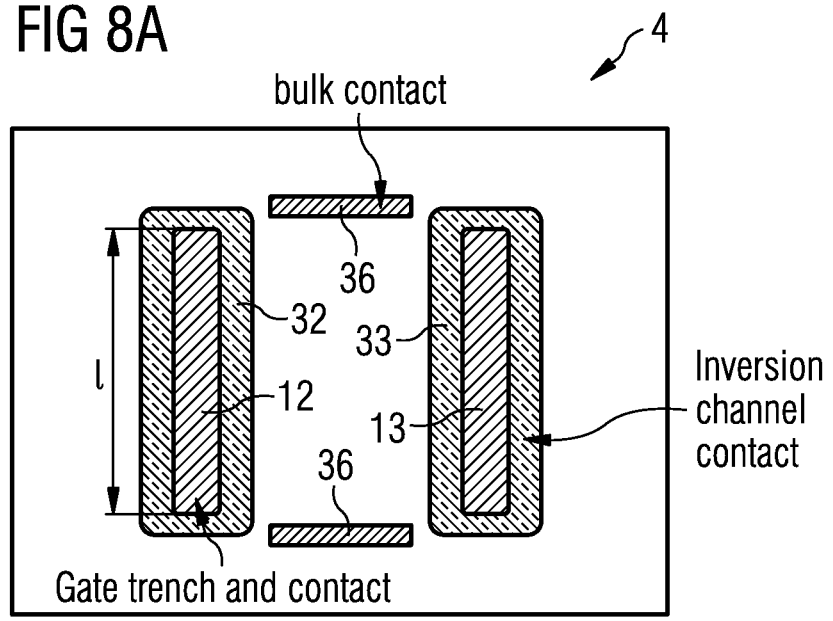
FIG. 8A shows a schematic top view of an imaging circuit according to an embodiment.
Figure 8B:
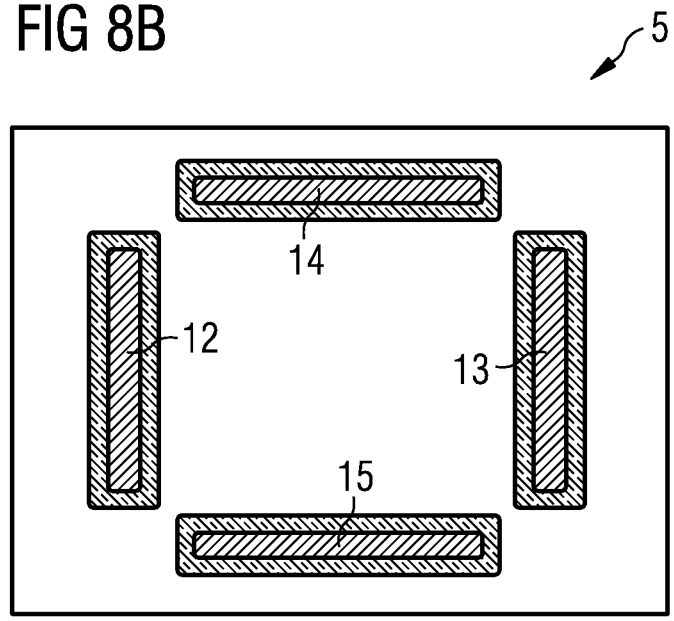
FIG. 8B shows a schematic top view of an imaging circuit according to an embodiment.

FIGS. 8A and 8B each show a schematic top view of an imaging circuit according to various embodiments. The imaging circuit may include a photocell may be used in various trench and contact arrangements. Besides a linear field for carrier collection there may be an option to use more than two electrodes for phase detection. This may lead to new readout versions.

FIG. 8A shows a suitable arrangement for a photocell, e.g. imaging circuit 4, according to an embodiment. For example, the bulk contact 36 may be located approximately halfway between first vertical trench gate 12 and second vertical trench gate 13 and may be arranged orthogonally to first 12 and second 13 vertical trench gate with regard to a largest lateral extension. In other examples, bulk contact 36 may be located elsewhere in the semiconductor substrate 10, for example, between a few micrometers and a few hundred micrometers in lateral direction away from the trenches.

The vertical trench gates 12, 13 may each have a length, I, (largest lateral extension) between 0.1 µm to 100 µm, or between 10 µm to 80 µm, or between 20 µm to 50 µm, e.g. about 30 µm, for example.

FIG. 8B shows another suitable arrangement for a photocell, e.g. part of an imaging circuit 5, according to an embodiment. In an embodiment, more than two electrodes may be used for phase detection. For example, four vertical trench gates 12, 13, 14, 15 may be used for phase detection. For example, first vertical trench gate 12 may be parallel to neighboring second vertical trench gate 13. Third 14 and fourth 15 vertical trench gate may be orthogonal to first 12 and second 13 vertical trench gate. The four vertical trench gates 12, 13, 14, 15 may be arranged to form a ring, or square. The four cell trenches allow for circular bias voltages.

The bulk contacts 36 may be located elsewhere in the semiconductor substrate. For example, the bulk contacts 36 may be located in parallel to and between parallel vertical trench gates. For example, the bulk contacts 36 may be located external to the ring or square of the four vertical trench gates.

The three-dimensional formation of space charge regions may generate cross-talk for some device geometries and may limit the shrinking potential of the device. The vertical trench gates may be elongated to minimize crosstalk between the vertical trench gates. Furthermore, as the bulk contacts are located further from the vertical trench gates crosstalk may be further minimized.

More details and aspects are mentioned in connection with embodiments described above or below (e.g. the first vertical trench gate, the second vertical trench gate, the collection contacts, and the bulk contact). The embodiments shown in FIGS. 8A and 8B may comprise one or more optional additional features corresponding to one or more aspects mentioned in connection with the proposed concept or one or more embodiments described above (e.g. FIGS. 1 to 3, 4A to 4D, 5 to 7).

Figure 9:
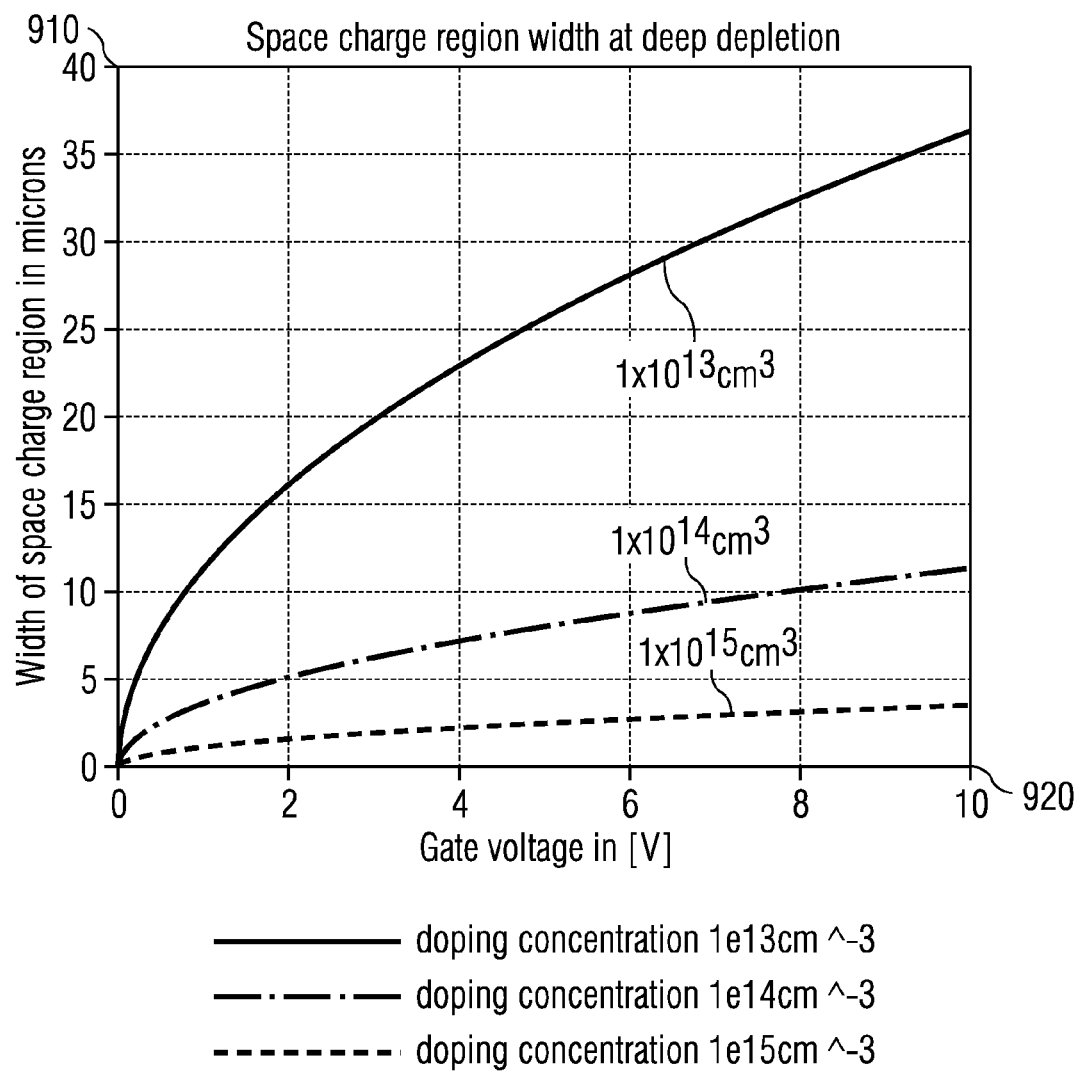
FIG. 9 shows a diagram indicating space charge region widths at deep depletion.

FIG. 9 shows a diagram indicating space charge region widths 910 at deep depletion (in the first operating mode) versus gate voltage bias 920. With decreasing doping concentrations, the width of the space charge region at deep depletion increases. For example, the width of the space charge region may be more than 35 µm at higher gate voltages (greater than 10V and lower doping concentrations, e.g. $1 \times 10^{13} cm^{-3}$.

Figure 10:
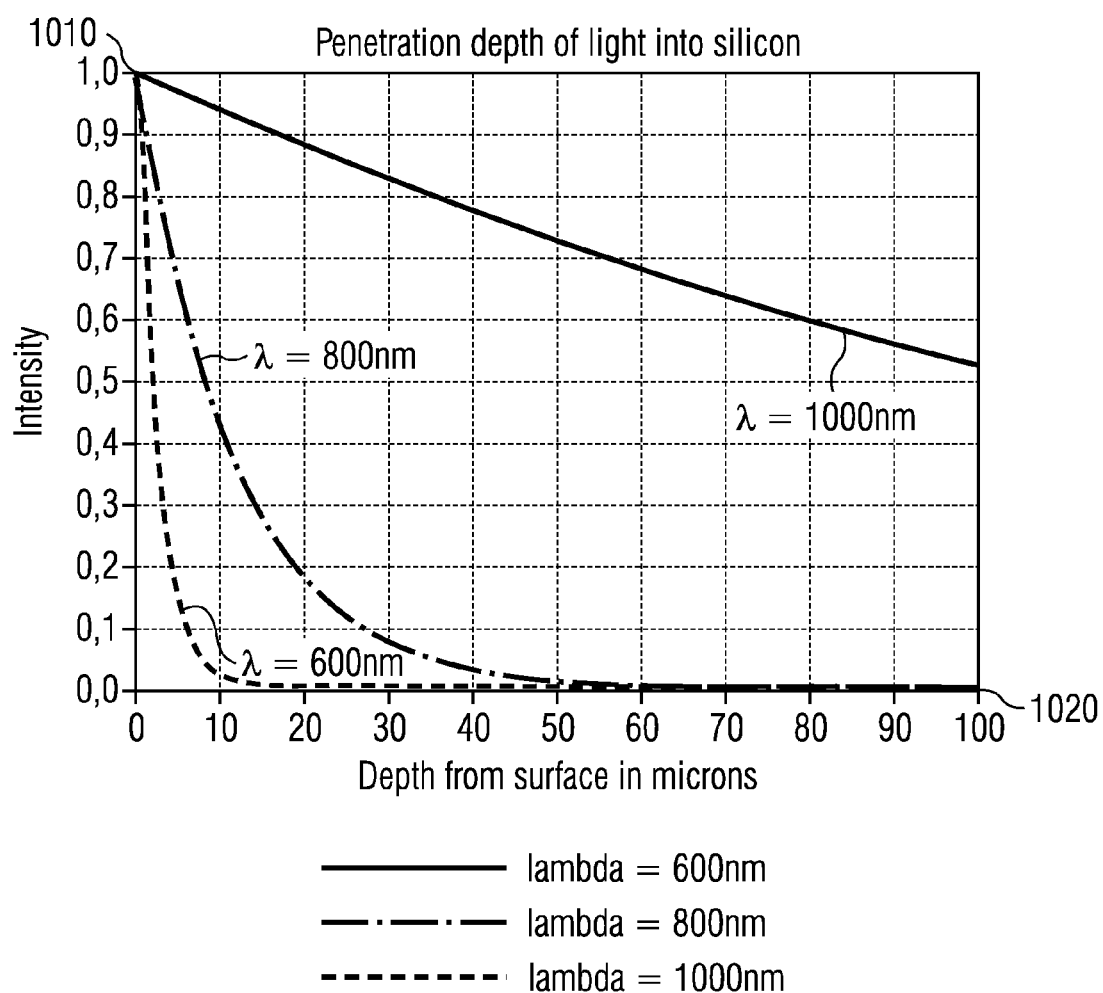
FIG. 10 shows a diagram indicating penetration depth of light into silicon.

FIG. 10 shows a diagram indicating the intensity 1010 versus penetration depth of light 920 into silicon. Three wavelengths, 600 nm, 800 nm and 1000 nm wavelengths are shown. While the intensity of 600 nm wavelength light falls to zero at less than 20 µm penetration into silicon, infra-red light generates electron hole pairs at least partly outside the space charge region at moderate substrate doping levels.

FIGS. 9 and 10 provide information about the relation of the depth of space charge regions at deep depletion to photon absorption depth.

Figure 11:
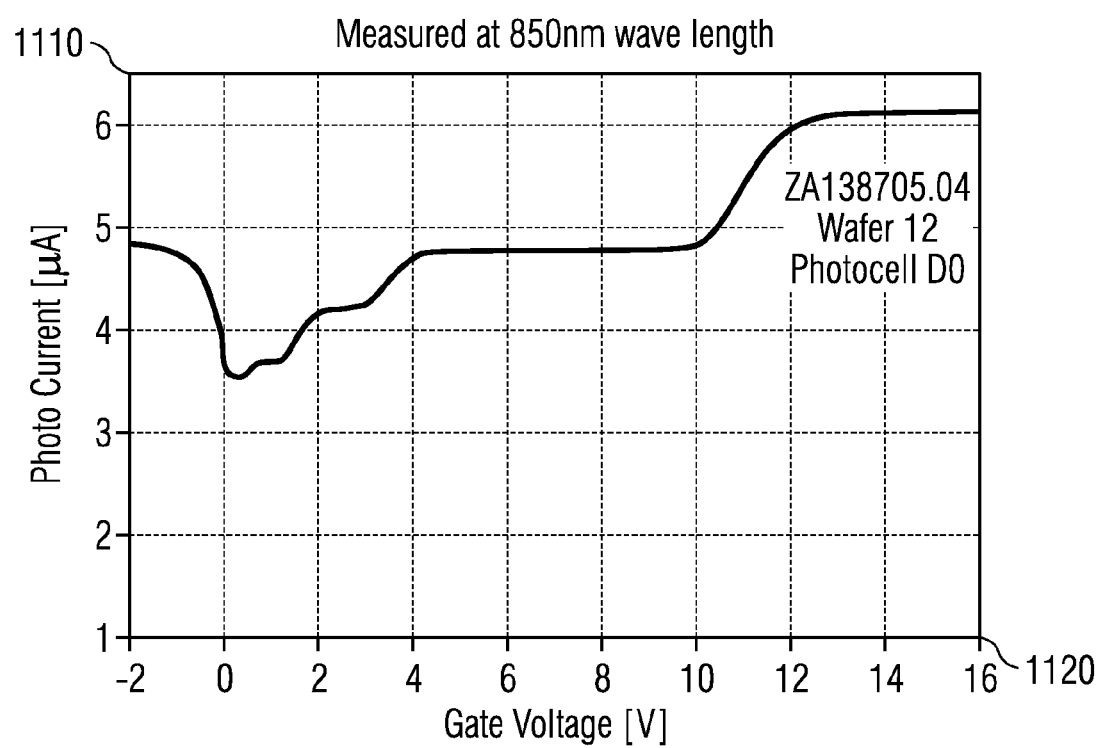
FIG. 11 shows a diagram indicating measured photocurrent as a function of trench gate voltage.

FIG. 11 shows a diagram indicating measured photocurrent 1110 as a function of trench gate voltage 1120. The photocurrent µA is generated by 850 nm light and is measured in response to increasing gate voltage. The variation of the gate voltage from -1 V to 16V may generate, the various accumulation and inversion stages illustrated in FIG. 4A to 4D, for example, the accumulation in the vicinity of the trench to inversion of the full trench surface. A maximum photocurrent is measured by the photocell when the gate voltage is about 12V, where full inversion of the trench surface has occurred.

Various embodiments relate to a photocell for joint 3D and color imaging.

Various embodiments relate to a photocell implemented as a photonic mixer device using a charge-coupled device (CCD) principle and two collecting diodes or more to allow a phase sensitive readout. A fast collection of photogenerated charge carriers are managed using transient switching modes. At fast bias sweep conditions, the semiconductor region underneath a MIS electrode may be pulsed into a deep depletion state. Under this operation mode, the depletion width is larger than the maximum depletion width under equilibrium. This effect may be used in devices with surface electrodes for carrier capturing, i.e. charge coupled devices or a photonic mixer device, and also used in various embodiments using vertical trench gate electrodes.

Various embodiments relate to a trench-based photo cell, that allows very fast capture of photo-generated charge carriers. It avoids time-consuming diffusion of carriers by using trenches for the creation of deeply depleted regions. The embodiments combine the operational mode with a color sensing routine where the toggled gate voltage is replaced by a gate voltage sweep. This allows a joint detection of 3D and color imaging by a single photo cell arrangement, in contrast to measurement principles using infra-red light for TOF measurements which are incapable of color recognition.

Various embodiments provide an imaging circuit whose read-out circuitry works in a time-critical domain due to the high velocity of light. According to various embodiments, the cell design and read-out technique of the imaging circuit may provide a fast capture and evaluation of photogenerated charge carriers. Furthermore, background current from carriers outside the space charge regions, which cause time-consuming carrier diffusion, may be avoided.

Example embodiments may further provide a computer program having a program code for performing one of the above methods, when the computer program is executed on a computer or processor. A person of skill in the art would readily recognize that acts of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. An imaging circuit, comprising:
   a semiconductor substrate;
   a first vertical trench gate and a neighboring second vertical trench gate extending into the semiconductor substrate;
   a gate control circuit configured to operate in a first operating mode to provide a first voltage to the first vertical trench gate and a second voltage to the second vertical trench gate to generate a first space charge region accelerating photogenerated charge carriers of a first charge-carrier type to a first collection contact in proximity to the first vertical trench gate, and to operate in a second operating mode to provide a third voltage to the first vertical trench gate to generate a second space charge region accelerating photogenerated charge carriers of the first charge-carrier type to the first collection contact in proximity to the first vertical trench gate; and
   an image processing circuit configured to determine distance information of an object based on photogenerated charge carriers of the first charge carrier type collected at the first collection contact in the first operating mode and to determine color information of the object based on photogenerated charge carriers of the first charge carrier type collected at the first collection contact in the second operating mode.

2. The imaging circuit according to claim 1, wherein the gate control circuit is configured to operate in the first operating mode to provide the first voltage to the first vertical trench gate and the second voltage to the second vertical trench gate during a first time interval, and to provide the second voltage to the first vertical trench gate and the first voltage to the second vertical trench gate during a second time interval.

3. The imaging circuit according to claim 2, wherein providing the second voltage to the first vertical trench gate and the first voltage to the second vertical trench gate generates a third space charge region accelerating photogenerated charge carriers of the first charge-carrier type to a second collection contact in proximity to the second vertical trench gate.

4. The imaging circuit according to claim 2, wherein the gate control circuit is configured to provide the third voltage to the first vertical trench gate during a third time interval and to provide a fourth voltage to the first vertical trench gate during a fourth time interval in the second operating mode, wherein the third voltage and the fourth voltage are different.

5. The imaging circuit according to claim 2, wherein the gate control circuit is configured to provide in the second operating mode, the third voltage to the first vertical trench gate and the second vertical trench gate during a third time interval to further generate a further space charge region accelerating photogenerated charge carriers of the first charge-carrier type to a second collection contact in proximity to the second vertical trench gate.

6. The imaging circuit according to claim 1, wherein the image processing circuit is further configured to determine the distance information of the object additionally based on photogenerated charge carriers of the first charge carrier type collected at a second collection contact in proximity to the second vertical trench gate in the first operating mode.

7. The imaging circuit according to claim 1, wherein in the second operating mode, the second space charge region accelerates photogenerated charge carriers of a second charge-carrier type to a bulk contact connected to the semiconductor substrate.

8. The imaging circuit according to claim 1, wherein at least a part of the photogenerated charge carriers of the first charge-carrier type accelerated during the first operating mode are generated by electromagnetic waves having a first wavelength of interest, and wherein at least a part of the photogenerated charge carriers of the first charge-carrier type accelerated during the second operating mode are generated by electromagnetic waves having a second wavelength of interest, wherein the first wavelength of interest and the second wavelength of interest are different.

9. The imaging circuit according to claim 8, wherein the electromagnetic waves having the first wavelength of interest are electromagnetic waves in the infra-red spectrum.

10. The imaging circuit according to claim 8, wherein the gate control circuit is configured to provide the third voltage to the first vertical trench gate so that the second space charge region extends at least into a depth of the semiconductor substrate, wherein a predetermined percentage or a majority of photogenerated charge carriers generated by the electromagnetic waves having the second wavelength of interest are generated within the second space charge region.

11. The imaging circuit according to claim 8, wherein the electromagnetic waves having the second wavelength of interest are electromagnetic waves in the visible spectrum.

12. The imaging circuit according to claim 1, wherein the image processing circuit is configured to determine, in the second operating mode, color information of a first color information type of the object based on the photogenerated charge carriers of the first charge-carrier type generated during the provision of the third voltage to the first vertical trench gate and to determine color information of a second color information type of the object based on photogenerated charge carriers generated during a provision of a fourth voltage to the first vertical trench gate.

13. The imaging circuit according to claim 1, wherein the image processing circuit is configured to generate image data of a three-dimensional color image of the object based on the distance information and the color information.

14. The imaging circuit according to claim 1, wherein the semiconductor substrate has a doping which gradually increases along the first vertical trench gate.

15. The imaging circuit according to claim 1, wherein the first vertical trench gate is located in a first vertical trench and insulated from the semiconductor substrate by an insulating layer inside the first vertical trench, wherein the insulating layer has a non-uniform stoichiometry.

16. The imaging circuit according to claim 1, wherein the first vertical trench gate is located in a first vertical trench and insulated from the semiconductor substrate by an insulating layer inside the first vertical trench, wherein a thickness of the insulating layer increases into the semiconductor substrate.

17. The imaging circuit according to claim 1, wherein the first vertical trench gate and the second vertical trench gate extend more than 5 µm into the semiconductor substrate.

18. An imaging circuit, comprising
a semiconductor substrate;
a plurality of vertical trench gates extending into the semiconductor substrate, each respective vertical trench gate having a corresponding collection contact in its proximity for collecting photogenerated charge carriers of a first charge-carrier type;
a gate control circuit configured to provide each of the plurality of vertical trench gates with a different voltage during a collection time interval, each respective vertical trench gate generating a respective space charge region for accelerating photogenerated charge carriers of the first charge-carrier type to its respective collection contact; and
an image processing circuit configured to determine color information of a plurality of color information types of an object, the color information of each color information type based on photogenerated charge carriers of the first charge carrier type collected at each corresponding collection contact.

19. The imaging circuit according to claim 18, comprising an array of vertical trench gates organized in groups of vertical trench gates, wherein each group of vertical trench gates comprises a plurality of vertical trench gates provided with the different voltages, wherein the image processing circuit is configured to determine the color information of the plurality of color information types of the object for each group of vertical trench gates.

20. A method for operating an imaging circuit, the method comprising:
providing, in a first operating mode, a first voltage to a first vertical trench gate and a second voltage to a second vertical trench gate to generate a first space charge region accelerating photogenerated charge carriers of a first charge-carrier type to a first collection contact in proximity to the first vertical trench gate;
providing, in a second operating mode, a third voltage to the first vertical trench gate to generate a second space charge region accelerating photogenerated charge carriers of the first charge-carrier type to the first collection contact in proximity to the first vertical trench gate;
determining distance information of an object based on photogenerated charge carriers of the first charge carrier type collected at the first collection contact in the first operating mode; and
determining color information of the object based on photogenerated charge carriers of the first charge carrier type collected at the first collection contact in the second operating mode.

* * * * *